(12) United States Patent
Li et al.

(10) Patent No.: US 8,048,488 B2
(45) Date of Patent: Nov. 1, 2011

(54) METHODS FOR REMOVING A STABILIZER FROM A METAL NANOPARTICLE USING A DESTABILIZER

(75) Inventors: Yuning Li, Mississauga (CA); Hadi K. Mahabadi, Mississauga (CA); Hualong Pan, Mississauga (CA); Yiliang Wu, Mississauga (CA); Ping Liu, Mississauga (CA); Paul F. Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 962 days.

(21) Appl. No.: 12/013,643

(22) Filed: Jan. 14, 2008

(65) Prior Publication Data
US 2009/0181177 A1    Jul. 16, 2009

(51) Int. Cl.
*B05D 5/12* (2006.01)
(52) U.S. Cl. ..................... 427/383.1; 427/347
(58) Field of Classification Search ............... 427/383.1, 427/331, 63, 71, 96.1, 97.4, 120, 125, 97.1, 427/347
See application file for complete search history.

(56) References Cited

U.S. PATENT DOCUMENTS

| | | | |
|---|---|---|---|
| 6,890,624 B1 * | 5/2005 | Kambe et al. | 428/195.1 |
| 2003/0063155 A1 * | 4/2003 | Nakao et al. | 347/44 |
| 2005/0162366 A1 * | 7/2005 | Moriya et al. | 345/97 |
| 2006/0202342 A1 * | 9/2006 | Andreyushchenko et al. | 257/758 |
| 2007/0031606 A1 * | 2/2007 | Miyazawa | 427/421.1 |
| 2007/0289483 A1 * | 12/2007 | Cho et al. | 106/31.13 |
| 2008/0296567 A1 * | 12/2008 | Irving et al. | 257/43 |

* cited by examiner

*Primary Examiner* — Michael Cleveland
*Assistant Examiner* — Tabassom Tadayyon Eslami
(74) *Attorney, Agent, or Firm* — Oliff & Berridge, PLC

(57) ABSTRACT

A method of forming conductive features on a substrate, the method comprising: providing two or more solutions, wherein a metal nanoparticle solution contains metal nanoparticles with a stabilizer and a destabilizer solution contains a destabilizer that destabilizes the stabilizer, liquid depositing the metal nanoparticle solution and the destabilizer solution onto the substrate, wherein during deposition or following the deposition of the metal nanoparticle solution onto the substrate, the metal nanoparticle and the destabilizer are combined with each other, destabilizing the stabilizer from the surface of the metal nanoparticles with the destabilizer and removing the stabilizer and destabilizer from the substrate by heating the substrate to a temperature below about 180° C. or by washing with the solvent.

21 Claims, 2 Drawing Sheets

METHODS FOR REMOVING A STABILIZER FROM A METAL NANOPARTICLE USING A DESTABILIZER

BACKGROUND

Fabrication of electronic circuit elements using liquid deposition techniques is of profound interest as such techniques provide potentially low-cost alternatives to conventional mainstream amorphous silicon technologies for electronic applications such as thin-film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge.

Solution-processable conductors are of great interest for printed electronic applications as electrodes, conducting lines in thin-film transistors, RFID tags, photovoltaics, etc. Metal nanoparticle-based inks represent a promising class of materials for printed electronics. However, most metal nanoparticles require large molecular weight stabilizers to ensure proper solubility and stability. These large molecular weight stabilizers inevitably raise the annealing temperatures of the metal nanoparticles above 200° C. in order to burn off the stabilizers, which temperatures are incompatible with most plastic substrates and can cause damage thereto.

Further, the use of lower molecular weight stabilizers can also be problematic, as smaller size stabilizers often do not provide desired solubility and often fail to effectively prevent coalescence or aggregation of the metal nanoparticles before use.

One of the advantages achieved by embodiments herein is that the addition of a destabilizer to stabilized metal nanoparticles during or after the deposition of the metal nanoparticles interferes with the interaction between the stabilizer and the metal nanoparticles or decomposes the stabilizer molecules into smaller derivatives. As a result, a stable metal nanoparticle solution for liquid deposition is obtained, and also the post-deposition thermal annealing temperatures can be much lower due to the removal of the stabilizer following liquid deposition.

SUMMARY

Disclosed generally are a method for forming a conductive feature on a substrate and a method for manufacturing a thin-film transistor using metal nanoparticles that are stabilized with a stabilizer, enabling the stabilizer, destabilizer, and other reaction by-products to be removed by 1) thermal annealing at a low temperature, for example, below about 180° C., or 2) washing the substrate with a solvent, and thus that can be used to form metal features on a wider range of substrates.

In embodiments, the application relates to a method for destabilizing the stabilizer from a metal nanoparticle. Upon removal of the stabilizer, the metal nanoparticle can be used to fabricate conductive elements having sufficiently high conductivity for electronic devices by heating at a low temperature, for example, below about 180° C., or by washing with a solvent. The metal nanoparticles prepared in accordance with the present procedures possess, in embodiments, 1) good stability or shelf life and/or 2) low annealing temperatures, and/or 3) good solubility, and may be made into metal nanoparticle compositions with suitable liquids, and may be used in fabricating liquid-processed conductive elements for electronic devices.

In embodiments, described is a method of forming conductive features on a substrate, the method comprising: providing two or more solutions, wherein a metal nanoparticle solution contains metal nanoparticles with a stabilizer and a destabilizer solution contains a destabilizer that destabilizes the stabilizer, liquid depositing the metal nanoparticle solution onto the substrate, wherein during the deposition or following the deposition of the metal nanoparticle solution onto the substrate, the metal nanoparticles with a stabilizer and the destabilizer are combined with each other, destabilizing the stabilizer from the surface of the metal nanoparticles with the destabilizer, and removing the stabilizer, destabilizer and reaction by-products from the substrate by heating the substrate to a temperature below about 180° C. or by washing with a solvent.

In further embodiments, described is a method of manufacturing a thin-film transistor, which comprises a substrate, a gate electrode, a gate dielectric layer, a source electrode and a drain electrode and including a semiconductor layer in contact with the source/drain electrodes and the gate dielectric layer, the method comprising: providing a substrate with a gate electrode and a gate dielectric layer, providing two or more solutions, wherein a metal nanoparticle solution contains metal nanoparticles with a stabilizer and a destabilizer solution contains a destabilizer that destabilizes the stabilizer, liquid depositing the metal nanoparticle solution onto the substrate or gate dielectric layer, wherein during the deposition or following the deposition of the metal nanoparticle solution onto the substrate or gate dielectric layer, the metal nanoparticle and the destabilizer are combined with each other; destabilizing the stabilizer from the surface of the metal nanoparticles with the destabilizer, removing the stabilizer, destabilizer and reaction by-products from the substrate by heating the substrate to a temperature below about 180° C. or washing with a solvent, and forming conductive features on the substrate as the gate, source and/or drain electrodes.

EMBODIMENTS

Figure 1:
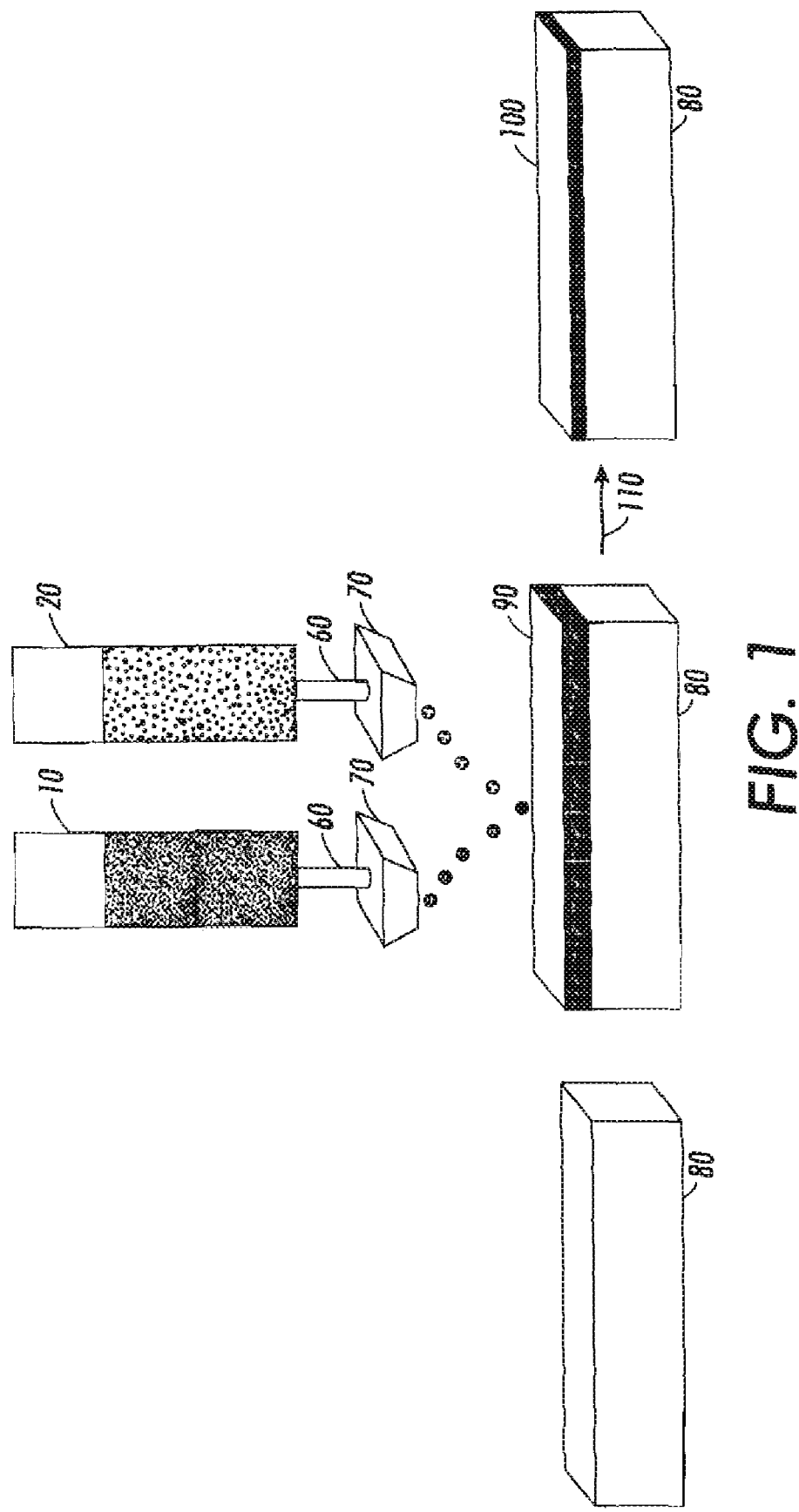
FIG. 1 illustrates an embodiment where the metal solution and destabilizer solution are transferred to the same or separate printheads by feed lines connected to the printhead and simultaneously printed onto the substrate to form metal features using an inkjet printer.

Described is a method of forming conductive features on a substrate wherein a stabilized metal nanoparticle solution is deposited onto a substrate and a destabilizer solution is deposited onto the sample substrate to destabilize the stabilizer. Destabilizing the stabilizer refers to, for example, any method of weakening the interaction or cleaving the connection between the stabilizer and the metal nanoparticles, including decomposing and/or removing the stabilizer. The stabilizer used to stabilize the metal nanoparticles is subsequently removed by heating at a temperature below about 180° C., or by washing with a solvent.

The metal nanoparticle solution herein includes a metal nanoparticle in a liquid system. In embodiments, the metal nanoparticles are composed of (i) one or more metals or (ii)

one or more metal composites. Suitable metals may include, for example, Al, Ag, Au, Pt, Pd, Cu, Co, Cr, In, and Ni, particularly the transition metals, for example, Ag, Au, Pt, Pd, Cu, Cr, Ni, and mixtures thereof. Silver may be used as a suitable metal. Suitable metal composites may include Au—Ag, Ag—Cu and Au—Ag—Pd. The metal composites may include non-metals, such as, for example, Si, C, O, S, Se, P, and Ge. The various components of the metal composite may be present in an amount ranging for example from about 0.01% to about 99.9% by weight, particularly from about 10% to about 90% by weight. In embodiments, the metal composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the metal nanoparticles do not include the stabilizer.

The term "nano" as used in "metal nanoparticles" refers to, for example, a particle size of less than about 1,000 nanometers (nm), such as from about 0.5 nm to about 1,000 nm, for example, from about 1 nm to about 800 nm, from about 1 nm to about 500 nm, from about 1 nm to about 100 nm or from about 1 nm to about 20 nm. The particle size refers to the average diameter of the metal particles, as determined by TEM (transmission electron microscopy) or other suitable method.

As the liquid system, any suitable liquid or solvent may be used for the metal nanoparticle solution, including, for example, organic solvents and water. The volume of the solvent in the metal nanoparticle solution is, for example, from about 10 weight percent to about 98 weight percent, from about 50 weight percent to about 90 weight percent and from about 60 weight percent to about 85 weight percent. For example, the liquid solvent may comprise water, an alcohol such as, for example, methanol, ethanol, propanol, butanol, pentanol, hexanol, heptanol, octanol or combinations thereof; a hydrocarbon such as, for example, pentane, hexane, cyclohexane, heptane, octane, nonane, decane, undecane, dodecane, tridecane, tetradecane, toluene, benzene, xylene, mesitylene, tetrahydrofuran; chlorobenzene; dichlorobenzene; trichlorobenzene; nitrobenzene; cyanobenzene; acetonitrile; or combinations thereof.

One, two, three or more solvents may be used in the metal nanoparticle solution. In embodiments where two or more solvents are used, each solvent may be present at any suitable volume ratio or molar ratio such as for example from about 99 (first solvent): 1 (second solvent) to about 1 (first solvent): 99 (second solvent).

The concentration of metal in the metal nanoparticle solution may be, for example, from about 2 weight percent to about 90 weight percent, from about 5 weight percent to about 80 weight percent, from about 10 weight percent to about 60 weight percent, or from about 15 weight percent to about 50 weight percent, of the metal nanoparticle solution.

The stabilizer preferentially associates with the external surface of the metal nanoparticles. By doing so, the metal nanoparticles are able to remain sufficiently stable in a dispersed solution, that is, remain suspended in the solution in a substantially homogeneously distributed manner, for a time period where there is minimal precipitation or aggregation of the nanoparticles such as, for example, at least about 3 hours, or from about 3 hours to about 1 month, from about 1 day to about 3 months, from about 1 day to about 6 months, from about 1 week to over 1 year, prior to liquid deposition. In this way, when liquid deposited, good conductive features may be formed on the substrate.

The stabilizer on the surface of the metal nanoparticles can be any suitable compound such as a compound comprising a moiety selected from the group consisting of —$NH_2$ such as butylamine, pentylamiine, hexylamine, heptylamine, octylamine, nonylamine, decylainine, undecylamine, dodecylamine, tridecylamine, tetradecylamine, pentadecylamine, hexadecylamine, oleylamine, octadecyl amine, diaminopentane, diaminohexane, diaminoheptane, diaminooctane, diaminononane, diaminodecane, diaminooetane, —NH— such as dipropylamine, dibutylamine, dipentylamine, dihexylamine, diheptylamine, dioctylamine, dinonylamine, didecyl amine, methylpropylamine, ethylpropylamine, propylbutylamine, ethylbutylamine, ethylpentylamine, propylpentylamine, butylpentylamine, polyethyleneimine, an ammonium salt such as tributylammonium bromide, didodecyldimethylammonium bromide, benzyltmethylammonium chloride, —SH such as butanethiol, pentanethiol, hexanethiol, heptanethiol, octanethiol, nonanethiol, decanethiol, undecanethiol, dodecanethiol, —$SO_2M$ (M is $NH_4^+$, $Li^+$, $Na^+$, $K^+$, or $Cs^+$) such as sodium octylsulfate, sodium dodecylsulfate, —OH (alcohol) such as terpinol, starch, glucose, poly(vinyl alcohol), —$C_5H_4N$ (pyridyl) such as poly(vinylpyridine), poly(vinylpyridine-co-styrene), poly(vinylpyridine-co-butyl methacrylate), —C(=O)OH such as butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, pamitoleic acid, poly(acrylic acid), —OC(=S)SH (xanthic acid), such as O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid, and R'R"P— and R'R–P(=O)—. R' and R" are hydrocarbon groups. Examples of R'R"P— and R'R"P(=O)— may include trioctyiphosphine and trioctylphosphine oxide, or a combination thereof.

Unless other-wise indicated, in identifying the substituents for R, R' and R" the phrase "hydrocarbon group" encompasses both unsubstituted hydrocarbon groups and substituted hydrocarbon groups. Unsubstituted hydrocarbon groups may include any suitable substituent such as, for example, a straight chain or branched alkyl group, a cycloalkyl group, an aryl group, an alkylaryl group, arylalkyl group or combinations thereof. Alkyl and cycloalkyl substituents may contain from about 1 to about 30 carbon atoms, from about 5 to 25 carbon atoms and from about 10 to 20 carbon atoms. Examples of akyl and cycloalkyl substituents include, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, and combinations thereof. Aryl groups substituents may contain from about 6 to about 48 carbon atoms, from about 6 to about 36 carbon atoms, from about 6 to about 24 carbon atoms. Examples of aryl substituents include, for example, phenyl, methylphenyl (tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, or combinations thereof. Substituted hydrocarbon groups may be the unsubstituted hydrocarbon groups described herein which are substituted with one, two or more times with, for example, a halogen (chlorine, fluorine, bromine and iodine), a nitro group, a cyano group, an alkoxy group (methoxy, ethoxy and propoxy), or heteroaryls. Examples of heteroaryls groups may include thienyl, fruranyl, pyridinyl, oxazoyl, pyrroyl, triazinyl, imidazoyl, pyrimidinyl, pyrazinyl, oxadiazoyl, pyrazoyl, triazoyl, thiazoyl, thiadiazoyl, quinolinyl, quinazolinyl, naphthynddinyl, carbazoyl, or combinations thereof.

Thus, in embodiments is described a method of forming conductive features on a substrate, wherein the stabilized metal nanoparticle is combined with a destabilizer that destabilizes the stabilizer from the surface of metal nanoparticle. The destabilizer, stabilizer and any reaction by-products may be removed by heating at a temperature below about 180° C., or by washing with a solvent.

The stabilizer as used herein and further described in embodiments are those stabilizers that may be removed or that can form reaction by-products that may be removed by heating the metal nanoparticle to a temperature less than about 180° C. or by washing with a solvent with the addition of an additional destabilizer that interacts with or decomposes the stabilizer.

The amount of the stabilizer in the metal nanoparticle may be, for example, from about 1 weight percent to about 80 weight percent, from about 2 weight percent to about 60 weight percent, from about 5 weight percent to about 50 weight percent, or from about 10 weight percent to about 40 weight percent.

The stabilizer may be destabilized by combining the metal nanoparticle with a destabilizer during or following the deposition of the metal nanoparticle solution onto a substrate. The term "destabilize" as used herein refers to, for example, either 1) cleaving the stabilizer from its association with the surface of the metal nanoparticles or 2) decomposing of the stabilizer into smaller sized derivatives. Decomposition in this regard thus refers to, for example, a reduction of the size of the stabilizer, for example, by shortening the chain length of carbon chains therein. The decomposition results in derivatives that may or may not be stabilizers and that have lower molecular weights than the initial stabilizer.

In embodiments, the destabilizer in the destabilizer solution interacts with the stabilizer to disassociate the stabilizer from the surface of the metal nanoparticles. As used herein, the term "destabilizer" refers to any compound or composition that interacts with the stabilizer on the surface of the nanoparticles, resulting in the destabilization or facilitating the destabilization of stabilizer compound from the surface of the metal nanoparticles.

In embodiments, the stabilizer is physically or chemically associated with the surface of the metal nanoparticles. In this way, the nanoparticles have the stabilizer thereon outside of a liquid system. That is, the nanoparticles with the stabilizer thereon, may be isolated and recovered from the reaction mixture solution used in forming the nanoparticles.

As used herein, the phrase "physically or chemically associated" between the metal nanoparticles and the stabilizer can be a chemical bond and/or other physical attachment. The chemical bond can take the form of, for example, covalent bonding, hydrogen bonding, coordination complex bonding, or ionic bonding, or a mixture of different chemical bonds. The physical attachment can take the form of, for example, van der Waals' forces or dipole-dipole interaction, or a mixture of different physical attachments. The destabilization of the stabilizer from the metal nanoparticles occurs through the use of a destabilizer and thus the stabilizer, destabilizer and other reaction by-products can be removed from the metal nanoparticles (1) by heating at a temperature below about 180° C., or (2) by washing with a solvent.

In embodiments, the type of the destabilizer is specific to the type of stabilizer used and can be a stabilizer itself to the metal nanoparticles. The destabilizer may also have stronger interactions than the stabilizer to the surface of the metal nanoparticles, but the destabilizer, in taking the place of the stabilizer on the surface of the metal nanoparticles, can be removed by heating the metal nanoparticle to a temperature below about 180° C., or by washing with a solvent.

In embodiments, the destabilizer in the destabilizer solution can be a reactant to the stabilizers. For example, organoamine-stabilized metal nanoparticles can be destabilized with an acid as a destabilizer such as, for example, a saturated aliphatic acid, unsaturated aliphatic acid, saturated aliphatic dicarboxylic acid, unsaturated aliphatic dicarboxylic acid, aromatic carboxylic acid, hydroxy carboxylic acid, methoxy carboxylic acid, carboxylic acid with a substituent or a hydrocarbon group, inorganic acid such as HCl, HBr, $HNO_3$, or mixtures thereof. As used herein, the term "organoamine" includes all amines substituted with one or more hydrocarbon groups. The acid or by-products of the acid and the organoamine can be removed by heating at a temperature below about 180° C., or by washing with a solvent. The acid reacts with the amine groups and thus forms the acid-organoamine complex that may or may not remain on the surface of the metal nanoparticles.

If a large excess of acid is used such as, for example, a short chain (from about 3 to 14 carbon atoms) carboxylic acid, most of the surface of the metal nanoparticles remain covered with carboxylic acid as the carboxylic acid has stronger interaction with the metal nanoparticles. The acid and the by-products of the acid-organoamine complex can be removed by heating at a temperature below about 180° C., or by washing with a solvent such as water, an alcohol, or a hydrocarbon.

If a larger chain carboxylic acid such as oleic acid is used, a short chain organothiol such as, for example, butanethiol, pentanethiol, hexanethiol, heptanethiol, octanethiol or combination thereof can be used as a destabilizer. As used herein, the term "organothiol" includes all thiols substituted with one or more hydrocarbon groups. An organothiol has a stronger interaction with the metal nanoparticles than a larger chain carboxylic acid and can replace the carboxylic acid on the surface of the metal nanoparticles. Thus, a metal nanoparticle stabilized with a short chain organothiol stabilizer can then be annealed at a temperature below about 180° C. to remove the organothiol stabilizer.

In embodiments, the destabilizer in the destabilizer solution can be a catalyst to facilitate the decomposition of the stabilizers. For example, ether or ester-containing stabilizers can undergo chain cleavage in the presence of an acid such as, for example, HCl, HBr, $HNO_3$ or $H_2SO_4$. Ether containing stabilizers may be represented by the formula $R(OCH_2CH_2)_n X$ where R is hydrogen or any suitable hydrocarbon group, n is the number of repeating units from about 1 to about 50, from about 2 to about 40 and from about 4 to about 25 and X is a functional group that stabilizes the metal nanoparticles and may be such as, for example, $-NH_2$, $-NH-$, $-SH$, $-SO_2M$ (wherein M may be $NH_4^+$, $Li^+$, $Na^+$, $K^+$, or $Cs^+$) $-OH$, $-C_5H_4N$, $-C(=O)OH$, $-OC(=S)SH$ (xanthic acid), R'R"P—, R'R"P(=O)— or combinations thereof. R' and R" are a hydrocarbon group.

Ester containing stabilizers may be represented by, for example, the formula RC(=O)OR'X or XR=C(=O)OR where R is hydrogen, or any suitable hydrocarbon group; R' is any suitable divalent moiety such as, for example, $-CH_2-$, $-CH_2CH_2-$, $-CH_2CH_2CH_2-$, $-CH_2CH_2CH_2CH_2$, phenylene, thienylene, or combinations thereof; and X is a functional group that stabilizes the metal nanoparticles such as, for example, —NH$_2$, —NH—, —SH, —SO$_2$M, wherein M is NH$_4^+$, Li$^+$, Na$^+$, K$^+$, or Cs$^+$, —OH, —C$_5$H$_4$N, —C(=O)OH, —OC(=S)SH (xanthic acid), R'R''P—, R'R''P(=O)—, or combinations thereof, and wherein R' and R'' are a hydrocarbon group. Further, the ether or ester-containing stabilizer can be a polymer that can form low molecular weight by-products in the presence of an acid destabilizer and the low molecular weight by-products can be removed by heating at a temperature below about 180° C., or by washing with a solvent.

As the liquid system, any suitable liquid or solvent used for the metal nanoparticle solution may also be used for the destabilizer solution, and the liquid or solvent used for the destabilizer solution may be the same or different liquid or solvent from the metal nanoparticle solution.

The concentration of the destabilizer in the destabilizer solution may be, for example, from about 1 weight percent to about 100 weight percent, from about 5 weight percent to about 80 weight percent, from about 10 weight percent to about 60 weight percent, or from about 20 weight percent to about 50 weight percent.

The fabrication of an electrically conductive element from a stabilized metal nanoparticle solution and a destabilizer solution can be carried out by depositing the stabilized metal nanoparticle solution and the destabilizer solution on a substrate using any liquid deposition technique at any suitable time prior to or subsequent to the formation of other optional layer or layers on the substrate. Thus, liquid deposition of the stabilized metal nanoparticle solution and the destabilizer solution on the substrate can occur either on a substrate or on a substrate already containing layered material, for example, a semiconductor layer and/or an insulating layer.

The phrases "liquid deposition technique" or "liquid depositing" refer to, for example, the deposition of a stabilized metal nanoparticle solution and a destabilizer solution using a liquid process such as liquid coating or printing. The stabilized metal nanoparticle solution and the destabilizer solution may be referred to as inks when printing is used. Examples of liquid coating processes may include, for example, spin coating, blade coating, rod coating, dip coating, and the like. Examples of printing techniques may include, for example, lithography or offset printing, gravure) flexography, screen printing, stencil printing, inkjet printing, stamping (such as microcontact printing), and the like. Liquid deposition deposits a layer comprising of the stabilized metal nanoparticle and the destabilizer having a thickness ranging from about 5 nanometers to about 5 micrometers, preferably from about 10 nanometers to about 1000 nanometers, which, at this stage, may or may not exhibit appreciable electrical conductivity.

In embodiments, liquid deposition can be implemented by using an inkjet printer, which has two or more reservoirs, a first reservoir containing a metal nanoparticle solution such as silver nanoparticles, and a second reservoir containing a destabilizer solution, with other optional components being present in the first, second and/or additional reservoirs. Printing may be effected from the reservoirs simultaneously or consecutively through one or more print heads onto a substrate. The metal nanoparticle and the destabilizer combine during or after printing on the substrate to destabilize the stabilizer.

In embodiments, the metal nanoparticle solution and the destabilizer solution are transferred to the same or separate printheads and combined during the printing of both the metal nanoparticle solution and the destabilizer solution onto the substrate. As used herein, "during printing" refers to, for example, the metal nanoparticle solution and the destabilizer solution being printed simultaneously onto the substrate from the same or different printheads, and thus that the respective solutions effectively combine during printing onto the substrate, even though the bulk of the destabilization (interaction between the destabilizer and the stabilizer) may occur following printing onto the substrate.

As a way of illustrating this embodiment, FIG. 1, for convenience, displays the metal nanoparticle solution and destabilizer solution being printed by separate printheads using an inkjet printer. In FIG. 1, the metal nanoparticle solution (10) and destabilizer solution (20) are transferred to separate printheads (70) by feed lines (60) connected to the printheads (70). Both solutions are simultaneously printed onto the substrate (80) to form features comprising of metal nanoparticles (90). A conductive metal film (100) is then formed with thermal annealing (110).

In embodiments, the metal nanoparticle solution and the destabilizer solution are combined on the substrate after first printing one of the solutions and thereafter subsequently printing the second solution onto the first printed solution. As used herein, "after printing" refers to, for example, the metal nanoparticle solution and the destabilizer solution being printed consecutively onto the substrate from the same or different printheads.

Figure 2:
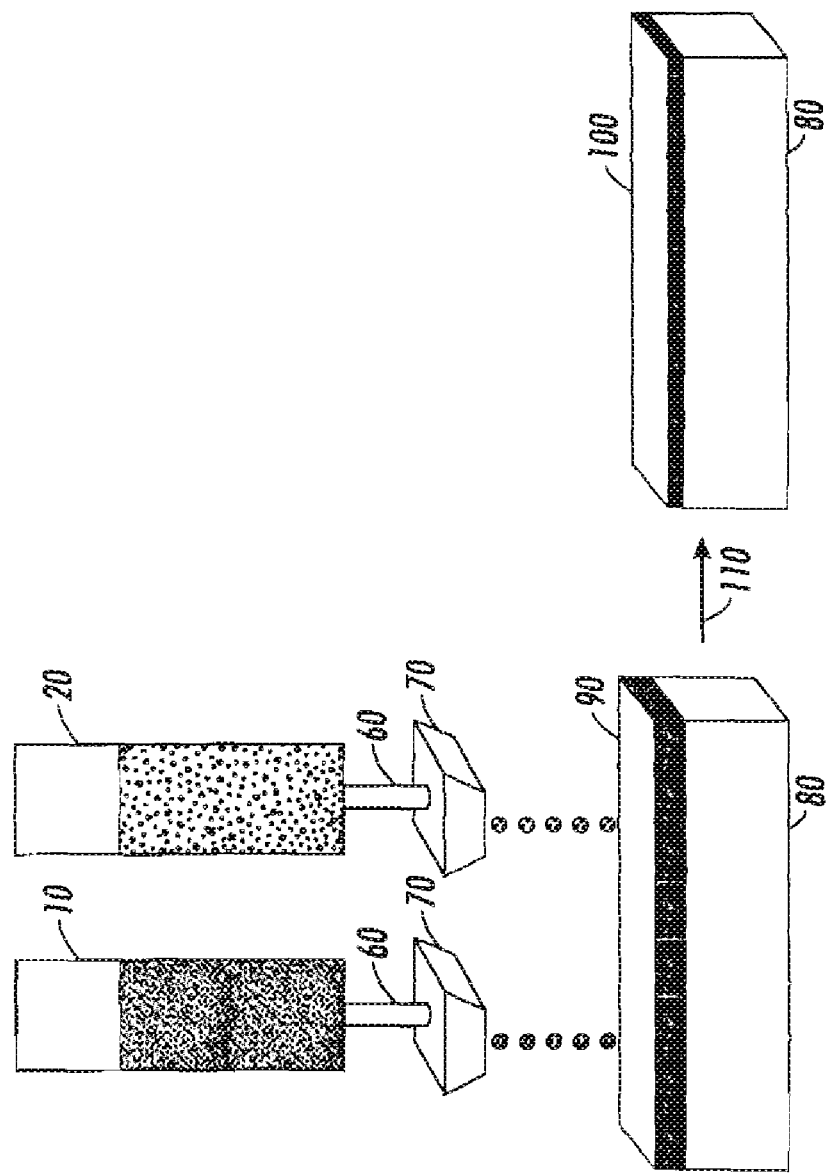
FIG. 2 illustrates an embodiment where a first solution, either a metal solution or a destabilizer solution, is printed onto the substrate, and the second solution, the other of the two solutions, is thereafter printed consecutively onto the first solution, in the same pattern, from the same or different printheads to form metal features using an inkjet printer.

As a way of illustrating this embodiment, FIG. 2, for convenience, displays the metal nanoparticle solution and destabilizer solution being printed by separate printheads using an inkjet printer. In FIG. 2, the metal nanoparticle solution (10) is transferred to the printhead (70) by a feed line (60) and printed onto the substrate (80). The destabilizer solution (20) is subsequently transferred to its printhead (70) by a feed line (60) and printed consecutively onto the substrate (80) with the previously printed metal nanoparticles to form features comprising of metal nanoparticles (90). A conductive metal film (100) is then formed with thermal annealing (110).

In embodiments, the stabilized metal nanoparticles solution and the destabilizer solution can be spin-coated, for example, for about 10 seconds to about 1000 seconds, for about 50 seconds to about 500 seconds or from about 100 seconds to about 150 seconds, onto a substrate at a speed, for example, from about 100 revolutions per minute ("rpm") to about 5000 rpm, from about 500 rpm to about 3000 rpm and from about 500 rpm to about 2000 rpm.

The substrate may be composed of, for example, silicon, glass plate, plastic film or sheet. For structurally flexible devices, a plastic substrate, such as, for example, polyester, polycarbonate, polyimide sheets and the like may be used. The thickness of the substrate may be from amount 10 micrometers to about 10 millimeters, from about 50 micrometers to about 2 millimeters, especially for a flexible plastic substrate and from about 0.4 millimeters to about 10 millimeters for a rigid substrate such as glass or silicon.

In embodiments, the destabilizer, stabilizer and any residual solvents or reaction by-products may be removed by heating the deposited metal nanoparticle and the destabilizer to a temperature of, for example, below about 180° C., at or below about 170° C., or at or about below 150° C., 1) to remove the stabilizer, the destabilizer, reaction by-products, and any residual solvents, and 2) to induce the metal nanoparticles to form an electrically conductive layer, which is suitable for use as an electrically conductive element in electronic devices. The heating temperature is one that does not cause adverse changes in the properties of previously deposited layer(s) or the substrate (whether single layer substrate or multilayer substrate). Also, the low heating temperatures described above allow the use of plastic substrates, which may not withstand annealing temperature above about 200° C.

In embodiments, the destabilizer, stabilizer, reaction by-products, and any residual solvents may also be removed by washing the deposited composition of the metal nanoparticles with a solvent. For example, the solvent may comprise, for example, water, hydrocarbon solvents such as pentane, hexane, cyclohexane, heptane, octane, nonane, decane, undecane, dodecane, tridecane, tetradecane, toluene, xylene, mesitylene, methanol, ethanol, propanol, butanol, pentanol, hexanol, heptanol, octanol, tetrahydrofuran, chlorobenzene, dichlorobenzene, trichlorobenzene, nitrobenzene, cyanobenzene, acetonitrile, dichloromethane, N,N-dimethylformamide (DMF and combinations thereof.

The heating can be performed for a time ranging from, for example, about 1 second to about 10 hours and from about 10 seconds to about 1 hour. The heating can be performed in air, in an inert atmosphere, for example, under nitrogen or argon, or in a reducing atmosphere, for example, under nitrogen containing from about 1 to about 20 percent by volume hydrogen. The heating can also be performed under normal atmospheric conditions or at a reduced pressure of, for example, from 1000 mars to about 0.01 mars.

As used herein, the term "heating" encompasses any technique(s) that can impart sufficient energy to the heated material to cause the desired result such as thermal heating (for example, a hot plate, an oven, and a burner), infra-red ("IR") radiation, microwave radiation, heating by a laser beam, or UV radiation, or a combination thereof.

Heating produces a number of effects. Prior to heating, the layer of the deposited metal nanoparticles may be electrically insulating or with very low electrical conductivity, but heating results in an electrically conductive layer composed of annealed metal nanoparticles, which increases the conductivity. In embodiments, the annealed metal nanoparticles may be coalesced or partially coalesced metal nanoparticles. In embodiments, it may be possible that in the annealed metal nanoparticles, the metal nanoparticles achieve sufficient particle-to-particle contact to form the electrically conductive layer without coalescence.

In embodiments, after beating, the resulting electrically conductive layer has a thickness ranging, for example, from about 5 nanometers to about 5 micrometers and from about 10 nanometers to about 1000 nanometers.

The resulting conductive elements can be used as electrodes, conductive pads, thin-film transistors, conductive lines, conductive tracks, and the like in electronic devices such as thin-film transistors, organic light emitting diodes, RFID (radio frequency identification) tags, photovoltaic, and other electronic devices which require conductive elements or components.

The conductivity of the resulting metal element produced by heating the deposited metal nanoparticle composition is, for example, more than about 100 Siemens/centimeter ("S/cm"), more than about 1000 S/cm, more than about 2,000 S/cm, more than about 5,000 S/cm, more than about 10,000 S/cm.

In yet other embodiments, there is provided a thin film transistor comprising:
(a) an dielectric layer;
(b) a gate electrode;
(c) a semiconductor layer;
(d) a source electrode;
(e) a drain electrode, and
(f) a substrate wherein the dielectric layer, the gate electrode, the semiconductor layer, the source electrode, the drain electrode and the substrate are in any sequence as long as the gate electrode and the semiconductor layer both contact the insulating dielectric layer, and the source electrode and the drain electrode both contact the semiconductor layer, and, the semiconductor layer is comprised of an organic, inorganic, or an organic/inorganic hybrid semiconductor compound.

In embodiments and with further reference to the present disclosure, the substrate layer may generally be a silicon material inclusive of various appropriate forms of silicon, a metal film or sheet, a glass plate, a plastic film or a sheet, a paper, a fabric, and the like depending on the intended applications. For structurally flexible devices, a metal film or sheet such as, for example, aluminum, a plastic substrate, such as, for example, polyester, polycarbonate, polyimide sheets, and the like, may be selected. The thickness of the substrate may be, for example, from about 10 micrometers to over 10 millimeters with a specific thickness being from about 50 micrometers to about 10 millimeters, especially for a flexible plastic substrate, and from about 0.5 to about 10 millimeters.

The insulating dielectric layer, which can separate the gate electrode from the source and drain electrodes, and in contact with the semiconductor layer, can generally be an inorganic material film, an organic polymer film, or an organic-inorganic composite film. Examples of inorganic materials suitable as the dielectric layer may include silicon oxide, silicon nitride, aluminum oxide, barium titanate, barium zirconate titanate, and the like. Examples of organic polymers for the dielectric layer may include polyesters, polycarbonates, poly (vinyl phenol), polyimides, polystyrene, poly(methacrylate)s, poly(acrylate)s, epoxy resin, and the like. Examples of inorganic-organic composite materials may include spin-on glass such as pMSSQ (polymethylsilsesquioxane), metal oxide nanoparticles dispersed in polymers, such as polyester, polyimide, epoxy resin, and the like. The thickness of the dielectric layer can be, for example, from about 1 nanometer to about 5 micrometer with a more specific thickness being about 10 nanometers to about 1000 nanometers. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of semiconductors, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of semiconductors.

The gate electrode can be a thin metal film, a conducting polymer film, a conducting film generated from a conducting ink or paste, or the substrate itself (for example heavily doped silicon). Examples of the gate electrode materials may include gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Eletrodag available from Acheson Colloids Company, and silver filled electrically conductive thermoplastic ink available from Noelle Industries, and the like. The gate layer may be prepared by vacuum evaporation, sputtering of metals or conductive metal oxides, coating from conducting polymer solutions or conducting inks, or dispersions by spin coating, casting or printing. The thickness of the gate electrode layer may be, for example, from about 10 nanometers to about 10 micrometers, and a specific thickness is, for example, from about 10 to about 1000 nanometers for metal films, and about 100 nanometers to about 10 micrometers for polymer conductors.

The source and drain electrode layer can be fabricated from materials which provide a low resistance ohmic contact to the semiconductor layer. Typical materials suitable for use as source and drain electrodes may include those of the gate electrode materials such as silver, gold, nickel, aluminum, platinum, conducting polymers, and conducting inks. Typical thickness of this layer may be, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

In embodiments, at least one of the gate, source or drain electrode in a thin-film transistor is formed by using a method described herein to form conductive features on a substrate, the method comprising: providing two or more solutions, wherein a metal nanoparticle solution contains metal nanoparticles with a stabilizer and a destabilizer solution contains a destabilizer that interacts with the stabilizer; liquid depositing the metal nanoparticle solution onto the substrate, wherein during the deposition or following the deposition of the metal nanoparticle solution onto the substrate, the metal nanoparticle solution and the destabilizer solution are combined each other; destabilizing the stabilizer from the surface of the metal nanoparticles with the destabilizer and removing the stabilizer, destabilizer and reaction by-products by heating the substrate to a temperature below about 180° C., or by washing with a solvent, to form conductive features on the substrate.

Other known suitable materials not recited herein for the various components of the TFT devices of the present disclosure can also be selected in embodiments.

EXAMPLE

Synthesis of Oleic Acid-stabilized Silver Nanoparticles a. Synthesis of Oleylamine-Stabilized Silver Nanoparticles Silver acetate (3.34 g, 20 mmol) and oleylamine (13.4 g, 50 mmol) are dissolved in 40 mL toluene and stirred at 55° C. for 5 minutes. Phenylhydrazine (1.19 g, 11 mmol) solution in toluene (10 mL) is added into above solution drop-wise with vigorous stirring and stirred at 55° C. for 10 additional minutes. The resulting solution forms a precipitate when added drop-wise to a mixture of acetone/methanol (150 mL/150 mL). The precipitate is subsequently filtered and washed briefly with acetone and methanol yielding a gray solid of oleylamine-stabilized silver nanoparticles.

b. Synthesis of Oleic Acid-stabilized Silver Nanoparticles

The oleylamine acid-stabilized nanoparticles are dissolved in 50 mL of hexane and subsequently added drop-wise to a solution of oleic acid (14.12 g, 50 mmol) in hexane (50 mL) at room temperature. After 30 minutes, hexane is removed and the residue poured into a solution of stirring methanol (200 mL). After filtration, washing with methanol and drying (in vacuo), a gray solid is obtained. The yield was 3.05 grams (96%, based on Ag content of 68% from TGA analysis).

Preparation of silver-nanoparticles solution (dispersion)

The oleic acid-stabilized silver nanoparticles are dissolved in toluene to form a dispersed homogeneous solution. The concentration of silver nanoparticles is 15 weight percent. Next, the dispersed solution is filtered using a 0.2 micron PTFE (polytetrafluoroethylene, Teflon) or glass filter.

Preparation of destabilizer solution using 1-butaniethiol as a destabilizer

A 15 weight percent solution of 1-butaniethiol is prepared by dissolving 1-butanethiol in toluene and filtered using a 0.2 micron PTFE or glass filter.

Printing on a substrate and annealing to form conductive silver patterns

The solution of oleic acid-stabilized silver nanoparticles and 1-butanethiol solution are laced into two separated cartridges of an inkjet printer and printed in a designed pattern onto a class substrate by first printing the oleic acid-stabilized silver nanoparticle solution onto the substrate and then printing 1-butaniethiol solution directly on top of the pattern where oleic acid-stabilized silver nanoparticle solution was printed. The glass substrate is then heated on a hotplate to a temperature of 140° C. for 30 minutes and cooled. Inspection confirms the formation of conductive silver patterns on the surface of the glass substrate.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of forming conductive features on a substrate, the method comprising:
    providing two or more solutions, wherein a metal nanoparticle solution contains metal nanoparticles with a stabilizer and a destabilizer solution contains a destabilizer that destabilizes the stabilizer,
    liquid depositing the metal nanoparticle solution onto the substrate, wherein during the deposition or following the deposition of the metal nanoparticle solution onto the substrate, the metal nanoparticles with a stabilizer and the destabilizer are combined with each other,
    destabilizing the stabilizer from the surface of the metal nanoparticles with the destabilizer, and
    removing the stabilizer and destabilizer from the substrate by heating the substrate to a temperature below about 180° C. or by washing with a solvent,
    wherein the destabilizing the stabilizer with the destabilizer decomposes the stabilizer into smaller size stabilizer derivatives.

2. The method according to claim 1, wherein the metal nanoparticles are selected from the group consisting of silver, gold, platinum, palladium, copper, cobalt, chromium, nickel, silver-copper composite, silver-gold composite, silver-gold-palladium composite and combinations thereof.

3. The method according to claim 1, wherein the metal nanoparticles are selected from a group consisting of silver, silver-copper composite, silver-gold composite, silver-gold-palladium composite and combinations thereof.

4. The method according to claim 1, wherein the concentration of metal nanoparticles in the metal nanoparticle solution is from about 5 weight percent to about 80 weight percent.

5. The method according to claim 1, wherein the stabilizer is a compound comprising a moiety selected from the group consisting of —$NH_2$, —NH—, —SH, —$SO_2$M, wherein M is $NH_4^+$, $Li^+$, $Na^+$, $K^+$, or $Cs^+$, —OH, —$C_5H_4N$, —C(=O)OH, —OC(=S)SH (xanthic acid), R'R"P—, R'R"P(=O)—, wherein R' and R" are each individually a hydrocarbon group, and combinations thereof.

6. The method according to claim 1, wherein the stabilizer in the metal nanoparticle solution includes an ether.

7. The method according to claim 1, wherein the stabilizer in the metal nanoparticle solution includes an ester.

8. The method according to claim 1, wherein the destabilizer in the destabilizer solution comprises a saturated aliphatic acid, unsaturated aliphatic acid, saturated aliphatic dicarboxylic acid, unsaturated aliphatic dicarboxylic acid, aromatic carboxylic acid, hydroxy carboxylic acid, methoxy carboxylic acid, carboxylic acid with a hydrocarbon group, inorganic acid, or combinations thereof.

9. The method according to claim 1, wherein the destabilizer in the destabilizer solution comprises an organothiol.

10. The method according to claim 1, wherein the concentration of the destabilizer in the destabilizer solution is from about one weight percent to about one hundred weight percent.

11. The method according to claim 1, wherein the solvent for removing the destabilizer is selected from the group consisting of water, pentane, hexane, cyclohexane, heptane, octane, nonane, decane, undecane, dodecane, tridecane, tetradecane, toluene, xylene, mesitylene, methanol, ethanol, propanol, butanol, pentanol, hexanol, heptanol, octanol, tetrahydrofuran, chlorobenzene, dichlorobenzene, trichlorobenzene, nitrobenzene, cyanobenzene, acetonitrile, dichloromethane, N,N-dimethylformamide (DMF), and combinations thereof.

12. The method according to claim 1, wherein the metal nanoparticle solution and the destabilizer solution are combined during the deposition of the metal nanoparticle solution onto the substrate by simultaneously depositing both the metal nanoparticle solution and the destabilizer solution onto the substrate.

13. The method according to claim 1, wherein the metal nanoparticle and the destabilizer are combined following the deposition of the metal nanoparticle solution onto the substrate by first depositing one of the metal nanoparticle solution and the destabilizer solution onto the substrate and thereafter subsequently printing the other of the metal nanoparticle solution and the destabilizer solution onto a first deposited solution.

14. The method according to claim 1, wherein the liquid depositing is selected from the group consisting of spin coating, blade coating, rod coating, dip coating, lithography or offset printing, gravure, flexography, screen printing, stencil printing, inkjet printing, and stamping.

15. The method according to claim 1, wherein the liquid depositing is conducted with an inkjet printer, which has two or more reservoirs, including a first reservoir containing a metal nanoparticle solution, and a second reservoir containing a destabilizer solution, and the solutions are printed from the reservoirs simultaneously or consecutively through one or more print heads onto a substrate.

16. A method of manufacturing a thin-film transistor, which comprises a substrate, a gate electrode, a gate dielectric layer, a source electrode and a drain electrode and a semiconductor layer in contact with the source/drain electrodes and the gate dielectric layer, the method comprising:
    providing a substrate with or without a gate electrode and a gate dielectric layer,
    providing two or more solutions, wherein a metal nanoparticle solution contains metal nanoparticles with a stabilizer and a destabilizer solution contains a destabilizer destabilizes the stabilizer,
    liquid depositing the metal nanoparticle solution onto the substrate or gate dielectric layer to form a gate electrode, source electrode and/or drain electrode, wherein during the deposition or following the deposition of the metal nanoparticle solution onto the substrate or gate dielectric layer, the metal nanoparticle and the destabilizer are combined with each other,
    destabilizing the stabilizer from the surface of the metal nanoparticles with the destabilizer,
    removing the stabilizer, destabilizer, and reaction by-products from the substrate by heating the substrate to a temperature below about 180° C. or washing with a solvent, and
    forming conductive features on the substrate as the gate, source, and/or drain electrodes
    wherein destabilizing the stabilizer with the destabilizer decomposes the stabilizer into smaller size stabilizer derivatives.

17. The method according to claim 16, wherein the stabilizer is a compound comprising a moiety selected from the group consisting of —$NH_2$, —NH—, —SH, —$SO_2$M, wherein M is $NH_4^+$, $Li^+$, $Na^+$, $K^+$, or $Cs^+$, —OH, —$C_5H_4N$, —C(=O)OH, —OC(=S)SH (xanthic acid), R'R"P—, R'R"P(=O)—, wherein R' and R" are each individually a hydrocarbon group, and combinations thereof.

18. The method according to claim 16, wherein the destabilizer in the destabilizer solution comprises a saturated aliphatic acid, unsaturated aliphatic acid, saturated aliphatic dicarboxylic acid, unsaturated aliphatic dicarboxylic acid, aromatic carboxylic acid, hydroxy carboxylic acid, methoxy carboxylic acid, carboxylic acid with a hydrocarbon group, inorganic acid, or combinations thereof.

19. The method according to claim 16, wherein the destabilizer in the destabilizer solution comprises an organothiol.

20. The method according to claim 16, wherein the solvent for removing the destabilizer is selected from the group consisting of water, pentane, hexane, cyclohexane, heptane, octane, nonane, decane, undecane, dodecane, tridecane, tetradecane, toluene, xylene, mesitylene, methanol, ethanol, propanol, butanol, pentanol, hexanol, heptanol, octanol, tetrahydrofuran, chlorobenzene, dichlorobenzene, trichlorobenzene, nitrobenzene, cyanobenzene, acetonitrile, dichloromethane, N,N-dimethylformamide (DMF), and combinations thereof.

21. The method according to claim 16, wherein the liquid depositing is selected from the group consisting of spin coating, blade coating, rod coating, dip coating, lithography or offset printing, gravure, flexography, screen printing, stencil printing, inkjet printing, and stamping.

* * * * *